United States Patent
Huggins

(10) Patent No.: US 6,743,731 B1
(45) Date of Patent: Jun. 1, 2004

(54) METHOD FOR MAKING A RADIO FREQUENCY COMPONENT AND COMPONENT PRODUCED THEREBY

(75) Inventor: Harold Alexis Huggins, Watchung, NJ (US)

(73) Assignee: Agere Systems Inc., Allentown, PA (US)

(*) Notice: Subject to any disclaimer, the term of this patent is extended or adjusted under 35 U.S.C. 154(b) by 36 days.

(21) Appl. No.: 09/715,651

(22) Filed: Nov. 17, 2000

(51) Int. Cl.[7] .................................. H01L 21/302
(52) U.S. Cl. .................. 438/706; 438/710; 438/712; 438/720; 216/2
(58) Field of Search .............................. 438/706, 710, 438/712, 720; 216/2, 41, 67

(56) References Cited

U.S. PATENT DOCUMENTS

| | | | |
|---|---|---|---|
| 4,502,932 A | 3/1985 | Kline et al. | 204/192 EC |
| 4,556,812 A | 12/1985 | Kline et al. | 310/324 |
| 4,719,383 A | 1/1988 | Wang et al. | 310/324 |
| 4,890,370 A | 1/1990 | Fukuda et al. | 29/25.35 |
| 4,988,957 A | 1/1991 | Thompson et al. | 331/107 |
| 5,067,004 A | * 11/1991 | Marshall et al. | 357/71 |
| 5,075,641 A | 12/1991 | Weber et al. | 331/108 C |
| 5,166,646 A | 11/1992 | Avanic et al. | 331/107 |
| 5,185,589 A | 2/1993 | Krishnaswamy et al. | 333/133 |
| 5,231,327 A | 7/1993 | Ketcham | 310/366 |
| 5,232,571 A | 8/1993 | Braymen | 204/192.22 |
| 5,233,259 A | 8/1993 | Krishnaswamy et al. | 310/324 |
| 5,283,458 A | 2/1994 | Stokes et al. | 257/416 |
| 5,291,159 A | 3/1994 | Vale | 333/188 |
| 5,294,898 A | 3/1994 | Dworsky et al. | 333/187 |
| 5,303,457 A | 4/1994 | Falkner, Jr. et al. | 29/25.35 |
| 5,334,960 A | 8/1994 | Penunuri | 333/193 |
| 5,348,617 A | 9/1994 | Braymen | 156/644 |
| 5,367,308 A | 11/1994 | Weber | 343/700 |
| 5,373,268 A | 12/1994 | Dworsky et al. | 333/187 |
| 5,381,385 A | 1/1995 | Greenstein | 367/140 |
| 5,403,701 A | 4/1995 | Lum et al. | 430/315 |
| 5,404,628 A | 4/1995 | Ketcham | 29/25.35 |
| 5,424,698 A | * 6/1995 | Dydyk et al. | 333/219.2 |
| 5,438,554 A | 8/1995 | Seyed-Bolorforosh et al. | 367/140 |
| 5,446,306 A | 8/1995 | Stokes et al. | 257/416 |
| 5,552,655 A | 9/1996 | Stokes et al. | 310/330 |
| 5,587,620 A | 12/1996 | Ruby et al. | 310/346 |
| 5,596,239 A | 1/1997 | Dydyk | 310/311 |
| 5,617,065 A | 4/1997 | Dydyk | 333/166 |
| 5,630,949 A | 5/1997 | Lakin | 216/61 |
| 5,646,583 A | 7/1997 | Seabury et al. | 333/187 |

(List continued on next page.)

OTHER PUBLICATIONS

Ziaie et al., "A generic micromachined silicon platform for high-performance RF passive components" J. Micromech. Microeng. 10 (2000) p. 365–371.

Primary Examiner—Lan Vinh

(57) ABSTRACT

A method for making a radio frequency (RF) component includes forming a dielectric layer on a semiconductor substrate and forming and patterning a conductive layer on the dielectric layer to define the RF component. The dielectric layer may include SiN, the conductive layer may include aluminum, and the semiconductor substrate may include silicon, for example. At least one opening may be formed through the RF component at least to the semiconductor substrate. Moreover, the at least one opening may either extend into the semiconductor substrate or substantially terminate at a surface of the semiconductor substrate. The RF component may then be released from the semiconductor substrate by exposing the semiconductor substrate to an etchant passing through the at least one opening to the semiconductor substrate. Releasing the RF component may include exposing the semiconductor substrate to a dry etchant, such as $XeF_2$, for example.

18 Claims, 2 Drawing Sheets

U.S. PATENT DOCUMENTS

| | | | |
|---|---|---|---|
| 5,692,279 A | * 12/1997 | Mang et al. | 29/25.35 |
| 5,698,928 A | 12/1997 | Mang et al. | 310/322 |
| 5,702,775 A | 12/1997 | Anderson et al. | 428/1 |
| 5,714,917 A | 2/1998 | Ella | 332/144 |
| 5,760,663 A | 6/1998 | Pradal | 333/187 |
| 5,780,713 A | 7/1998 | Ruby | 73/1.82 |
| 5,789,845 A | 8/1998 | Wadaka et al. | 310/334 |
| 5,821,833 A | 10/1998 | Lakin | 333/187 |
| 5,853,601 A | * 12/1998 | Krishaswamy et al. | 216/2 |
| 5,864,261 A | 1/1999 | Weber | 333/187 |
| 5,872,493 A | 2/1999 | Ella | 333/191 |
| 5,873,153 A | 2/1999 | Ruby et al. | 29/25.35 |
| 5,873,154 A | 2/1999 | Ylilammi et al. | 29/25.35 |
| 5,883,575 A | 3/1999 | Ruby et al. | 340/572.5 |
| 5,884,378 A | 3/1999 | Dydyk | 29/25.35 |
| 5,894,647 A | 4/1999 | Lakin | 29/25.35 |
| 5,910,756 A | 6/1999 | Ella | 333/133 |
| 5,928,598 A | 7/1999 | Anderson et al. | 264/446 |
| 5,942,958 A | 8/1999 | Lakin | 333/189 |
| 5,963,856 A | 10/1999 | Kim | 455/307 |
| 5,998,816 A | * 12/1999 | Nataki et al. | 257/254 |
| 6,051,907 A | 4/2000 | Ylilammi | 310/312 |
| 6,060,818 A | 5/2000 | Ruby et al. | 310/363 |
| 6,081,171 A | 6/2000 | Ella | 333/189 |
| 6,087,198 A | 7/2000 | Panasik | 438/51 |
| 6,093,330 A | * 7/2000 | Chong et al. | 216/2 |
| 6,127,768 A | 10/2000 | Stoner et al. | 310/313 A |
| 6,131,256 A | * 10/2000 | Dydyk et al. | 29/25.35 |
| 6,150,703 A | 11/2000 | Cushman et al. | 257/415 |
| 6,198,208 B1 | 3/2001 | Yano et al. | 310/358 |
| 6,204,737 B1 | 3/2001 | Ella | 333/187 |
| 6,215,375 B1 | 4/2001 | Larson, III et al. | 333/187 |
| 6,355,498 B1 | * 3/2002 | Chan et al. | 438/48 |

* cited by examiner

METHOD FOR MAKING A RADIO FREQUENCY COMPONENT AND COMPONENT PRODUCED THEREBY

FIELD OF THE INVENTION

The present invention relates to the field of electronic circuits, and, more particularly, to methods for forming electronic circuits on dielectric layers.

BACKGROUND OF THE INVENTION

Radio frequency (RF) integrated circuits (ICs) and devices, such as inductors and capacitors, are well known for use in telecommunications applications. Many such devices and circuits are now being formed using thin dielectric layers or "membranes" made out of materials such as silicon nitride (SiN), for example. Such membranes have been found to improve the electrical characteristics of RF circuits mounted thereon. These membranes are typically formed on a substrate of suitable material, and the RF circuit is thereafter formed on the membrane which supports the RF circuit. The substrate provides support for the membrane during the patterning. Yet, capacitive coupling may occur between the substrate and the RF component, leading to device performance degradation.

To overcome this limitation, the RF component may be separated from the substrate. Prior art methods for removing the RF component from the substrate typically require etching a window through an opposite side of the substrate to release the membrane. This so-called "backside" etching may include using hot potassium hydroxide (KOH) to etch a silicon substrate, for example, where the dielectric layer acts as an etch stop layer. One difficulty with backside etching is that it requires careful double-sided alignment to make sure that the etched area corresponds with the membrane. Furthermore, due to the corrosiveness of the KOH, any exposed portions of the substrate must be protected from the etchant, e.g., by using a mask. Having to deposit and remove such a mask requires additional processing time and costs. Also, the etch rate of KOH is about 100 Am per hour. As a result, typical etch times for an eight inch wafer, for example, may be seven hours or greater.

A prior art technique which addresses some of the difficulties associated with backside etching is disclosed in U.S. Pat. No. 5,853,601 to Krishaswamy et al. entitled "Top-Via Etch Technique for Forming Dielectric Membranes." The patent is directed to methods for forming film bulk acoustic resonators (FBAR). The structure of an FBAR includes a substrate having a cavity on a surface thereof, a membrane on the substrate extending over the surface cavity, a first electrode on the membrane, a piezoelectric layer on the first membrane, and a second electrode layer on the piezoelectric layer. The method disclosed in the patent includes forming vias or openings through the membrane layer and isotropically etching the substrate through the vias using a dry etch process including an $SF_6$ gas. While this method does address the difficulty of backside alignment, it does not teach how to release the RF component from the substrate. Furthermore, the etching process disclosed in the patent still requires a relatively long etch time due to the nature of the reactive ion etchant. Such an etchant may also damage delicate circuit components of RF circuits like those described above.

SUMMARY OF THE INVENTION

In view of the foregoing background, it is therefore an object of the invention to provide a method for making a radio frequency (RF) component on a dielectric layer which alleviates the above noted problems associated with the prior art.

This and other objects, features, and advantages in accordance with the present invention are provided by a method for making an RF component including forming a dielectric layer on a semiconductor substrate and forming and patterning a conductive layer on the dielectric layer to define the RF component. The dielectric layer may include SiN, the conductive layer may include aluminum, and the semiconductor substrate may include silicon, for example. At least one opening may be formed through the RF component at least to the semiconductor substrate. Moreover, the at least one opening may either extend into the semiconductor substrate or substantially terminate at a surface of the semiconductor substrate. The RF component may then be released from the semiconductor substrate by exposing the semiconductor substrate to an etchant passing through the at least one opening to the semiconductor substrate.

Releasing the RF component may include exposing the semiconductor substrate to a dry etchant, such as $XeF_2$, for example. The at least one opening may have a diameter in a range of about 0.5 to 20 $\mu$m. Also, forming the at least one opening may include forming a plurality of openings laterally adjacent to portions of the conductive layer with no openings extending through the conductive layer. The plurality of openings may be formed in a predetermined pattern having substantially uniform spacing between adjacent openings, where the substantially uniform spacing is in a range of about 20 to about 200 $\mu$m, for example.

An RF component according to the invention is also provided. The RF component may include a dielectric layer having opposing first and second major surfaces, the first surface being free from a semiconductor substrate, the dielectric layer having a plurality of openings extending between the first and second opposing major surfaces. The RF component may also include a patterned conductive layer on the second major surface of the dielectric layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Also, the dimensions of layers and regions may be exaggerated in the figures for greater clarity.

Figure 1:
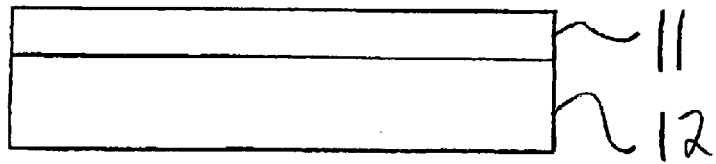
FIG. 1 is a cross-sectional diagram of a semiconductor substrate having a dielectric layer formed thereon according to the present invention.
Figure 2:
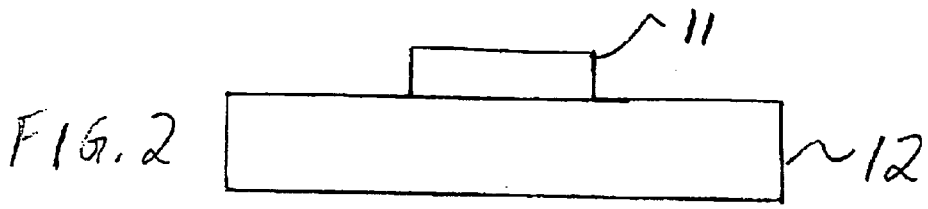
FIG. 2 is a cross-sectional diagram of the semiconductor substrate of FIG. 1 after the dielectric layer is patterned.

Referring now to the cross-sectional view of FIG. 1, a method for making a radio frequency (RF) component is first described. The method includes forming a dielectric layer 11 on a semiconductor substrate 12. The semiconductor substrate 12 may include silicon and the dielectric layer 11 may include SiN, for example. The dielectric layer 11 may be formed using conventional techniques known to those in the art (e.g., chemical vapor deposition). The dielectric layer 11 may then be patterned, again using conventional techniques, as shown in FIG. 2.

Figure 3:
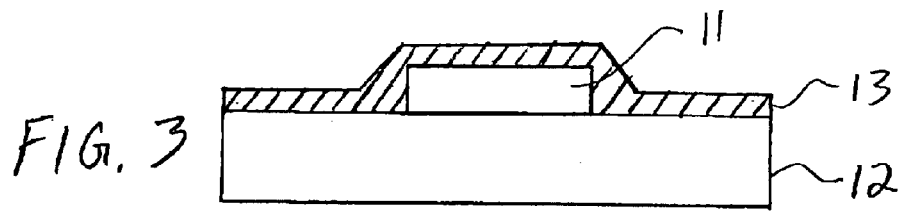
FIG. 3 is a cross-sectional diagram of the semiconductor substrate and patterned dielectric layer of FIG. 2 after the formation of a conductive layer thereon.
Figure 4:
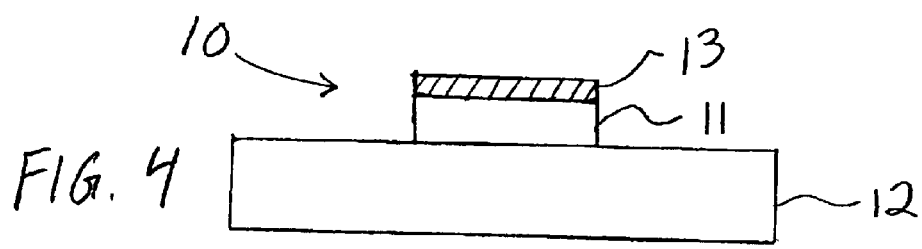
FIG. 4 is a cross-sectional diagram of the semiconductor substrate, patterned dielectric layer and conductive layer of FIG. 3 after patterning of the conductive layer to thereby form an RF component.
Figure 5:
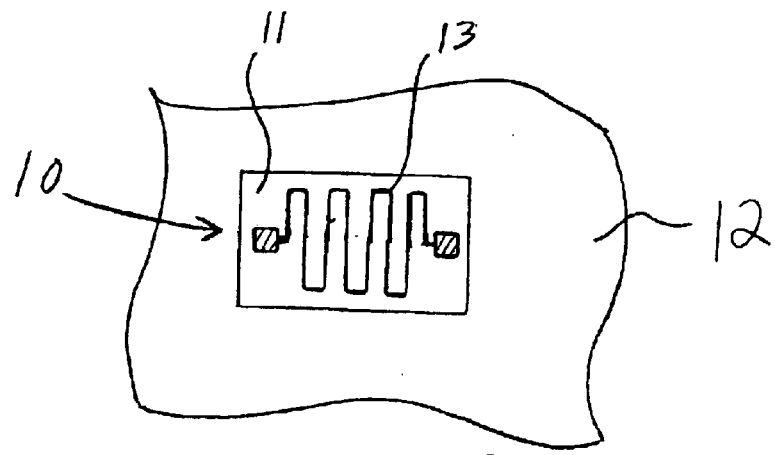
FIG. 5 is a top view showing the patterned conductive layer of FIG. 4.

A conductive layer 13 is then formed using conventional techniques on the dielectric layer 11 (FIG. 3). The conductive layer 13 may be patterned to define an RF component 10, as shown in FIGS. 4 and 5. Again, conventional lithographic and etch techniques known in the art may be used to pattern the conductive layer 13. The conductive layer may be aluminum, for example, although those of skill in the art will appreciate that other suitable conductors may be used as well. The conductive layer 13 of a typical RF component may be patterned to be an inductor or a capacitor, for example, though other circuit configurations are also possible.

Figure 6:
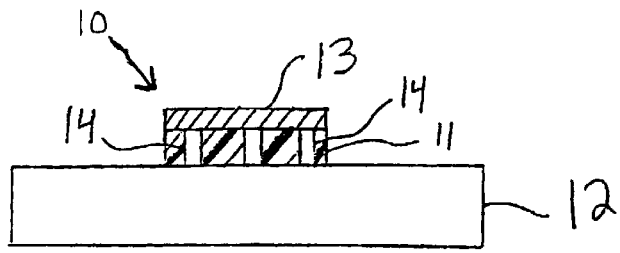
FIG. 6 is a cross-sectional view of the semiconductor substrate and patterned dielectric and conductive layers of FIG. 4 after forming openings in the dielectric layer.
Figure 7:
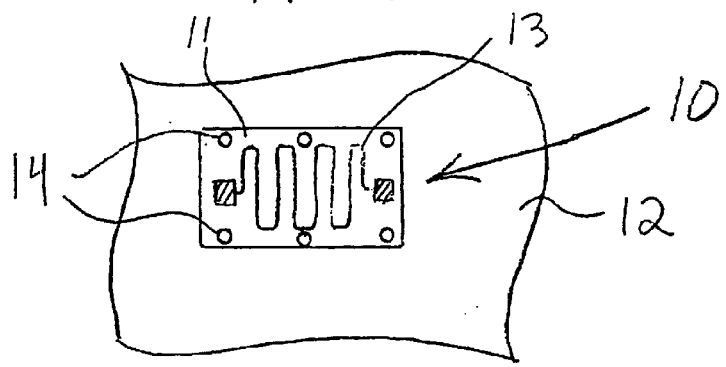
FIG. 7 is a top view showing the openings of FIG. 6.

At least one opening 14 is then formed through the RF component 10 at least to the semiconductor substrate 12, as seen in FIG. 6. In the illustrated example, six openings are formed in the RF component 10, as can be seen in the top view of FIG. 7. Of course, any number of openings 14 may be formed and the number selected will depend upon the size and shape of the component, the materials being used, etc., as will be appreciated by those of skill in the art. Specifically, the openings may substantially terminate at a surface of the semiconductor substrate 12, as shown in FIG. 6, or extend into the semiconductor substrate (not shown). The openings 14 may be formed using conventional lithographic and etch techniques, for example, as will be appreciated by those of skill in the art.

The openings 14 are preferably formed laterally adjacent portions of the conductive layer 13 with no openings extending through the conductive layer. Furthermore, the openings 14 may be formed in a predetermined pattern with substantially uniform spacing between adjacent openings. For example, the substantially uniform spacing may be in a range of about 20 to about 200 $\mu$m. Also, each of the openings 14 may have a diameter in a range of 0.5 to 20 $\mu$m, for example.

Figure 8:
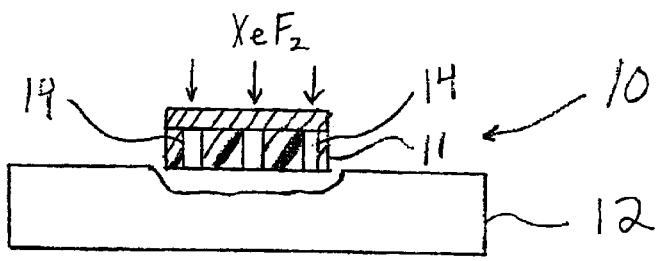
FIG. 8 is a cross-sectional view of the semiconductor substrate and patterned dielectric and conductive layers for FIG. 6 illustrating releasing of the patterned and conductive dielectric layers from the semiconductor substrate.

The RF component 10 may then be released from the semiconductor substrate 12 by exposing the semiconductor substrate to an etchant passing through the openings 14 to the semiconductor substrate, as illustrated in FIG. 8. The etchant may be a dry etchant, such as xenon difluoride ($XeF_2$) gas, for example. The $XeF_2$ may be used to etch silicon isotropically at a rate in a range of up to about 10 $\mu$m per minute, for example. Furthermore, by appropriately spacing the predetermined pattern of openings 14 for a given RF component, the semiconductor substrate 12 only needs to be etched in small amounts in each of the defined regions. The combination of the increased etch rate of $XeF_2$ and appropriate selection of the predetermined pattern significantly reduces the time required to release the RF component 10 from the semiconductor substrate 12 compared to prior art methods, as will be appreciated by those of skill in the art. By way of example, a typical etch time to release an RF component from a silicon substrate according to the invention may be about 20 minutes or less.

Additionally, $XeF_2$ is much less corrosive than prior art etchants, such as KOH and the like. As a result, the $XeF_2$ will have little effect on the RF component 10, so a mask need not be used to protect the RF component. Avoiding such a masking step not only reduces the complexity of manufacturing an RF component but also results in savings in time and costs. Additionally, if silicon, for example, is included in the conductive layer 13, the material (e.g., photoresist) used to define the pattern for the openings 14 would also serve to protect any exposed silicon from being etched, which would also further prevent additional process steps and reduce production time. The photoresist material will also protect exposed portions of the semiconductor substrate 12 from being unintentionally etched, as will be appreciated by those of skill in the art. Of course, those of skill in the art will also appreciate that the above described method also obviates the need for backside etching, which again reduces processing complexity and costs.

Figure 9:
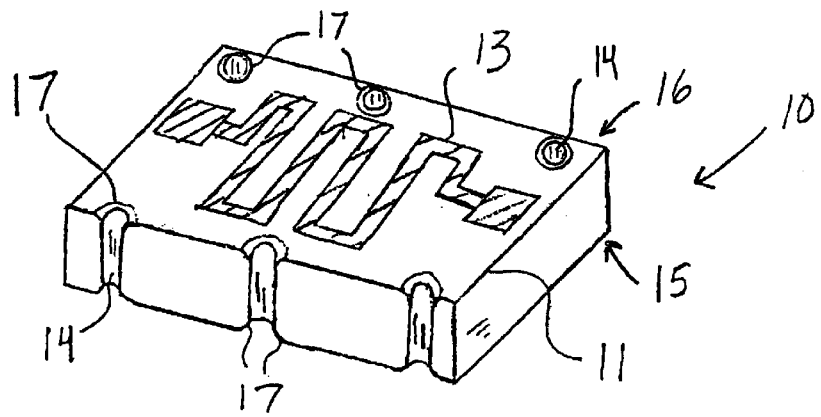
FIG. 9 is a perspective view of an RF component according to the present invention.

A completed RF component 10 made as described above may be seen in the perspective view of FIG. 9. The RF component 10 includes a dielectric layer 11 having opposing first and second major surfaces 15, 16, respectively. As can be seen, the first surface 15 is free from the semiconductor substrate 12. The dielectric layer 11 has a plurality of openings 14 extending between the first and second opposing major surfaces 15, 16. The RF component 10 also includes a patterned conductive layer 13 on the second major surface of said dielectric layer. The size, placement, and depth of the plurality of openings 14 may be similar to those described above. Each opening 14 may also have respective rounded over edges 17 adjacent the first and second major surfaces 15, 16 formed during etching of the openings 14, as will be appreciated by those of skill in the art.

Other devices and techniques using $XeF_2$ are disclosed in co-pending patent U.S. patent application, Ser. No. 09/637,069, filed Aug. 11, 2000, also assigned to present assignee, which is hereby incorporated herein in its entirety by reference. In addition, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making a radio frequency (RF) component comprising:

forming a dielectric layer on a semiconductor substrate;

forming and patterning a conductive layer on the dielectric layer to define the RF component;

forming a plurality of openings on opposing sides and through the RF component at least to the semiconductor substrate, the openings having a diameter ranging from about 0.5 to about 20 microns and substantially uniform spacing between adjacent openings in a range of about 20 to about 200 microns; and releasing the RF component from the semiconductor substrate by exposing the semiconductor substrate to a dry etchant comprising $XeF_2$ passing through the at least one opening to the semiconductor substrate.

2. The method of claim 1 wherein the openings are laterally adjacent portions of the conductive layer with no openings extending through the conductive layer.

3. The method of claim 1 wherein forming the plurality of openings comprises forming the plurality of openings in a predetermined pattern.

4. The method of claim 1 wherein the conductive layer comprises aluminum.

5. The method of claim 1 wherein the dielectric layer comprises SiN.

6. The method of claim 1 wherein the semiconductor substrate comprises silicon.

7. The method of claim 1 where in the openings extend into the semiconductor substrate.

8. The method of claim 1 wherein the openings substantially terminate at a surface of the semiconductor substrate.

9. A method for making a radio fluency (RF) component comprising:

forming a dielectric layer on a semiconductor substrate;

forming and patterning a conductive layer on the dielectric layer to define the RF component;

forming a plurality of openings on opposing sides and through the dielectric layer at least to the semiconductor substrate the openings having a diameter ranging from about 0.5 to about 20 microns and substantially uniform spacing between adjacent openings in a range of about 20 to about 200 microns; and releasing the RF component from the semiconductor substrate by exposing the semiconductor substrate to a dry etchant comprising $XeF_2$ passing through the openings to the semiconductor substrate.

10. The method of claim 9 wherein forming the plurality of openings comprises forming the plurality of openings in a predetermined pattern.

11. The method of claim 9 wherein the conductive layer comprises aluminum.

12. The method of claim 9 wherein the dielectric layer comprises SiN.

13. The method of claim 9 wherein the semiconductor substrate comprises silicon.

14. A method for making a radio frequency (RF) component comprising:

forming a dielectric layer on a semiconductor substrate;

forming and patterning a conductive layer on the dielectric layer to define the RF component;

forming a plurality of openings on opposing sides and through the dielectric layer in a predetermined pattern at least to the semiconductor substrate the openings having a diameter ranging from about 0.5 to about 20 microns and substantially uniform spacing between adjacent openings in a range of about 20 to about 200 microns; and releasing the RF component from the semiconductor substrate by exposing the semiconductor passing through substrate to a dry etchant comprising XeF2 passing the openings to the semiconductor substrate.

15. The method of claim 14 wherein the predetermined pattern has substantially uniform spacing between adjacent openings.

16. The method of claim 14 wherein the conductive layer comprises aluminum.

17. The method of claim 14 wherein the dielectric layer comprises SiN.

18. The method of claim 14 wherein the semiconductor substrate comprises silicon.

* * * * *